US009219451B2

(12) United States Patent
Tomioka

(10) Patent No.: US 9,219,451 B2
(45) Date of Patent: Dec. 22, 2015

(54) OPERATIONAL AMPLIFIER CIRCUIT

(71) Applicant: Seiko Instruments Inc., Chiba-shi, Chiba (JP)

(72) Inventor: Tsutomu Tomioka, Chiba (JP)

(73) Assignee: SEIKO INSTRUMENTS INC., Chiba (JP)

( * ) Notice: Subject to any disclaimer, the term of this patent is extended or adjusted under 35 U.S.C. 154(b) by 6 days.

(21) Appl. No.: 14/189,580

(22) Filed: Feb. 25, 2014

(65) Prior Publication Data
US 2014/0240041 A1 Aug. 28, 2014

(30) Foreign Application Priority Data

Feb. 26, 2013 (JP) .................. 2013-036211

(51) Int. Cl.
*H03F 1/02* (2006.01)
*H03F 3/387* (2006.01)
*H03F 3/45* (2006.01)

(52) U.S. Cl.
CPC ............ *H03F 3/387* (2013.01); *H03F 3/45475* (2013.01); *H03F 3/45968* (2013.01); *H03F 2200/261* (2013.01); *H03F 2203/45138* (2013.01)

(58) Field of Classification Search
CPC ....................................................... H03F 1/02
USPC ........................................ 330/9; 327/124, 307
See application file for complete search history.

(56) References Cited

U.S. PATENT DOCUMENTS

| | | | | |
|---|---|---|---|---|
| 5,663,680 A | * | 9/1997 | Nordeng ............................. | 330/9 |
| 7,535,295 B1 | * | 5/2009 | Huijsing et al. .................... | 330/9 |
| 7,973,596 B2 | * | 7/2011 | Eschauzier et al. ............... | 330/9 |
| 8,072,262 B1 | * | 12/2011 | Burt et al. ........................... | 330/9 |
| 2009/0278597 A1 | * | 11/2009 | Zhang et al. ....................... | 330/9 |
| 2009/0309653 A1 | * | 12/2009 | Luff .................................... | 330/9 |
| 2010/0289568 A1 | * | 11/2010 | Eschauzier et al. ............... | 330/9 |

* cited by examiner

*Primary Examiner* — Henry Choe
(74) *Attorney, Agent, or Firm* — Brinks Gilson & Lione

(57) ABSTRACT

Provided is an operational amplifier circuit capable of operating with lower current consumption. An amplifier stage, a FIR filter, and a sample and hold circuit are connected in series, thus enabling reduction of an input offset voltage and amplification of an input signal voltage without using an integral circuit. Current consumption of the operational amplifier circuit is reduced because the integral circuit is not used.

2 Claims, 3 Drawing Sheets

OPERATIONAL AMPLIFIER CIRCUIT

RELATED APPLICATIONS

This application claims priority under 35 U.S.C. §119 to Japanese Patent Application No. 2013-036211 filed on Feb. 26, 2013, the entire content of which is hereby incorporated by reference.

BACKGROUND OF THE INVENTION

1. Field of the Invention

The present invention relates to an operational amplifier circuit.

2. Description of the Related Art

FIG. 3 is a diagram illustrating a related-art operational amplifier circuit.

When a signal voltage is input to input terminals Vinn and Vinp, the signal voltage is modulated into a high frequency wave by a chopping circuit 81. The modulated signal voltage is input to an amplifier stage 82 and amplified. At this time, an input offset voltage of the amplifier stage 82 is also amplified simultaneously together with the modulated signal voltage. An output voltage of the amplifier stage 82 is input to a chopping circuit 83, and the signal voltage is demodulated and the input offset voltage of the amplifier stage 82 is modulated into a high frequency wave. The modulated offset voltage is chopping noise. A signal voltage output from the chopping circuit 83 is integrated by an integral circuit including an amplifier stage 84 and capacitors 85 and 86, to be a triangular wave. An output of the integral circuit is input to a switched capacitor notch filter 87. The switched capacitor notch filter 87 includes switches 93 to 100 and capacitors 101 to 103. A control clock of the switches 93 and 94 and the switches 99 and 100 and a control clock of the switches 95 to 98 are the same in frequency as a control clock of the chopping circuits 81 and 83, and have a relationship in which the waveforms are inverted.

Now, it is assumed that the signal voltage is a DC voltage and that the control clock of the chopping circuits 82 and 83 and a control clock of the switched capacitor notch filter 87 have a phase difference of 90°. In this case, the capacitor 101 and the capacitor 102 each hold the electric charges of the periodic signal voltage of the switched capacitor notch filter 87 at a constant point and transfer the electric charges to the capacitor 103. Thus, the electric charges stored in the capacitor 103 are always constant. Consequently, an input offset voltage component of the amplifier stage 82 is removed.

The signal voltage output from the switched capacitor notch filter 87 is amplified by an amplifier stage 88, and is added with a signal voltage amplified by an amplifier stage 80. In addition, the resultant signal voltage is amplified by an amplifier stage 89 to be an output voltage of the operational amplifier circuit. The input offset voltage of the amplifier stage 82 is removed, and hence, by using the operational amplifier circuit with feedback control, the input offset voltage of the operational amplifier can be regarded as being small. Further, in this case, the chopping noise caused by modulating the input offset voltage of the amplifier stage 82 is also removed by the switched capacitor notch filter 87.

The related-art operational amplifier circuit needs to generate a triangular wave by using the integral circuit including the amplifier stage 84 and the capacitors 85 and 86. However, this causes an increase in current consumption.

SUMMARY OF THE INVENTION

The present invention has been made in view of the above-mentioned problem, and provides an operational amplifier circuit capable of reducing an input offset voltage without generating a triangular wave by an integral circuit.

In order to solve the above-mentioned problem, an operational amplifier circuit according to one embodiment of the present invention is configured as follows.

The operational amplifier circuit includes an amplifier stage, a FIR filter, and a sample and hold circuit that are connected in series, thus enabling reduction of an input offset voltage and amplification of an input signal voltage without using an integral circuit.

The operational amplifier circuit according to one embodiment of the present invention configured as described above is capable of reducing the input offset voltage without using an integral circuit. Consequently, the operational amplifier circuit according to one embodiment of the present invention has an effect that current consumption is low.

DETAILED DESCRIPTION OF THE PREFERRED EMBODIMENTS

Now, an exemplary embodiment of the present invention is described with reference to the accompanying drawings.

Figure 1:
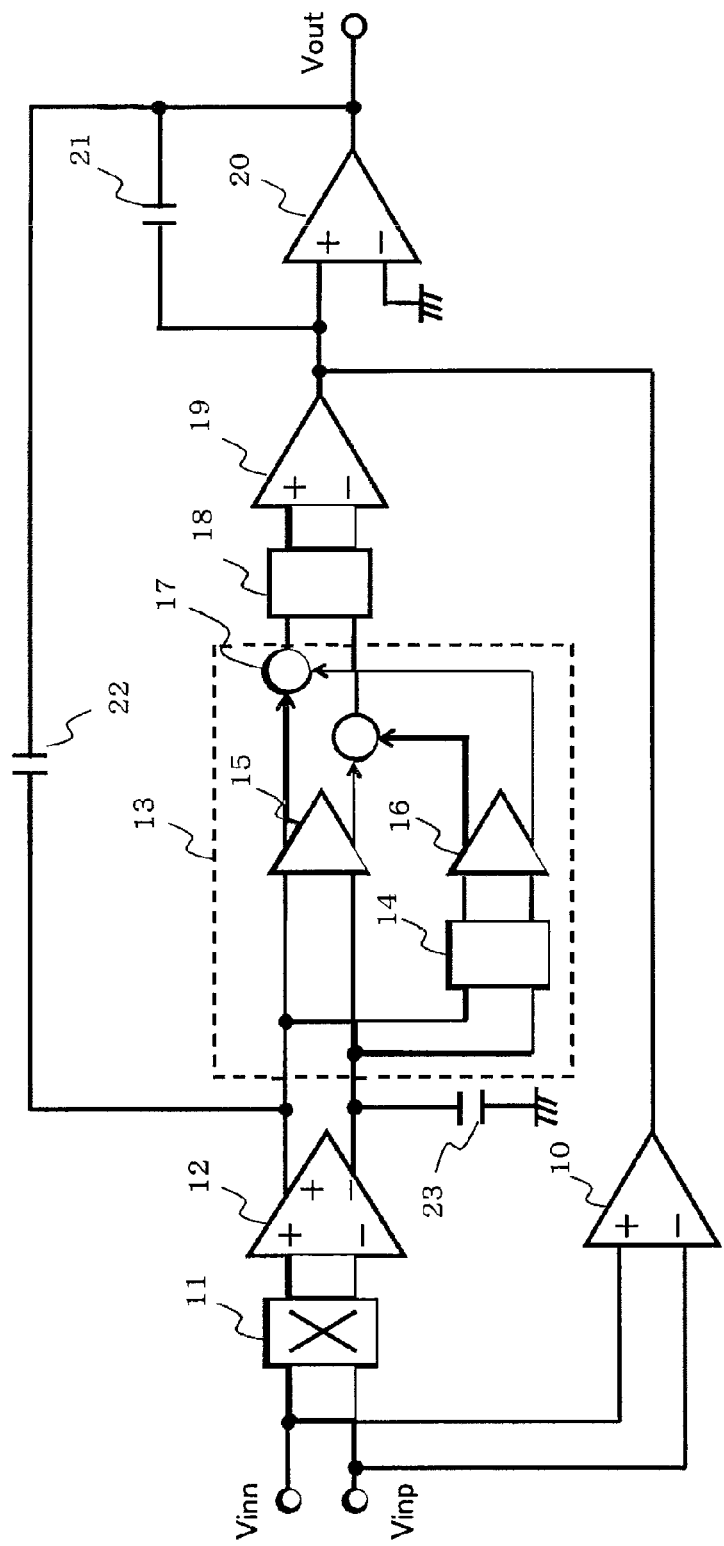
FIG. 1 is a block diagram illustrating an operational amplifier circuit according to an embodiment of the present invention.

First, a configuration of an operational amplifier circuit is described. FIG. 1 is a block diagram illustrating an operational amplifier circuit according to the embodiment of the present invention.

The operational amplifier circuit according to the embodiment of the present invention includes an amplifier stage 10, a chopping circuit 11, an amplifier stage 12, a FIR filter 13 including a delay circuit 14, a weighting circuit 15, a weighting circuit 16, and an adder circuit 17, a sample and hold circuit 18, an amplifier stage 19, an amplifier stage 20, a phase compensating capacitor 21, a phase compensating capacitor 22, and a phase compensating capacitor 23.

The chopping circuit 11 has input terminals connected to input terminals Vinn and Vinp of the operational amplifier circuit. The amplifier stage 12 has input terminals connected to output terminals of the chopping circuit 11. The delay circuit 14 has input terminals connected to output terminals of the amplifier stage 12. The weighting circuit 16 has input terminals connected to output terminals of the delay circuit 14. The weighting circuit 15 has input terminals connected to the output terminals of the amplifier stage 12. The adder circuit 17 has input terminals connected to an output terminal of the weighting circuit 15 and an output terminal of the weighting circuit 16. The sample and hold circuit 18 has input terminals connected to output terminals of the adder circuit 17. The amplifier stage 19 has input terminals connected to output terminals of the sample and hold circuit 18. The amplifier stage 20 has one input terminal connected to an output terminal of the amplifier stage 10 and an output terminal of the amplifier stage 19. The amplifier stage 20 has the other input terminal connected to a ground terminal. The operational amplifier circuit has an output terminal connected to an output terminal of the amplifier stage 20. The phase compensating capacitor 21 is connected between the output terminal and the one input terminal of the amplifier stage 20. The phase compensating capacitor 22 is connected between the output terminal of the amplifier stage 20 and one output terminal of the amplifier stage 12. The phase compensating capacitor 23 is connected between the other output terminal of the amplifier stage 12 and the ground terminal. Note that, the delay circuit 14, the weighting circuit 15, the weighting circuit 16, and the adder circuit 17 together construct the FIR filter 13.

Next, an operation of the operational amplifier circuit according to this embodiment is described.

A description is given of how to remove an input offset voltage Vos of the amplifier stage 12 in the case of "input signal voltage Vin=0". The amplifier stage 12 has an amplification factor $A_{12}$.

In this case, it is assumed that the input signal voltage Vin of the amplifier stage 12 is 0 V. A voltage Vo12 of the output terminal of the amplifier stage 12 is expressed by $A_{12} \times Vos$, which is obtained by amplifying the input offset voltage Vos of the amplifier stage 12 by the amplifier stage 12. The voltage Vo12 of the output terminal of the amplifier stage 12 is input to the input terminals of the FIR filter 13. In this case, the amplification factors of the weighting circuit 15 and the weighting circuit 16 are 0.5, and the delay time of the delay circuit 14 is a half period of the control clock of the chopping circuit 11 and the sample and hold circuit 18. A voltage Vo15 of the output terminal of the weighting circuit 15 is expressed by Vo15=0.5×Vo12=0.5×$A_{12}$×Vos. Further, a voltage Vo16 of the output terminal of the weighting circuit 16 is expressed by Vo16=0.5×Vo12=0.5×$A_{12}$×Vos, which is obtained by delaying the voltage Vo12 of the output terminal of the amplifier stage 12 by the delay circuit 14 by the half period of the control clock of the chopping circuit 11. In the adder circuit 17, the voltage Vo15 of the output terminal of the weighting circuit 15 and the voltage Vo16 of the output terminal of the weighting circuit 16 are added together. A voltage Vo17 of the output terminal of the adder circuit 17 becomes 0 V because the voltage Vo15 and the voltage Vo16 are the same in magnitude but reverse in polarity. The voltage Vo17 of the output terminal of the adder circuit 17 is input to the input terminals of the sample and hold circuit 18 so that the electric charges are stored and held. In this case, the voltage Vo17 of the output terminal of the adder circuit 17 is DC, and hence a voltage Vo18 of the output terminal of the sample and hold circuit 18 becomes equal to the voltage Vo17 (0 V). This means that the input offset voltage Vos of the amplifier stage 12 is removed.

Figure 2:
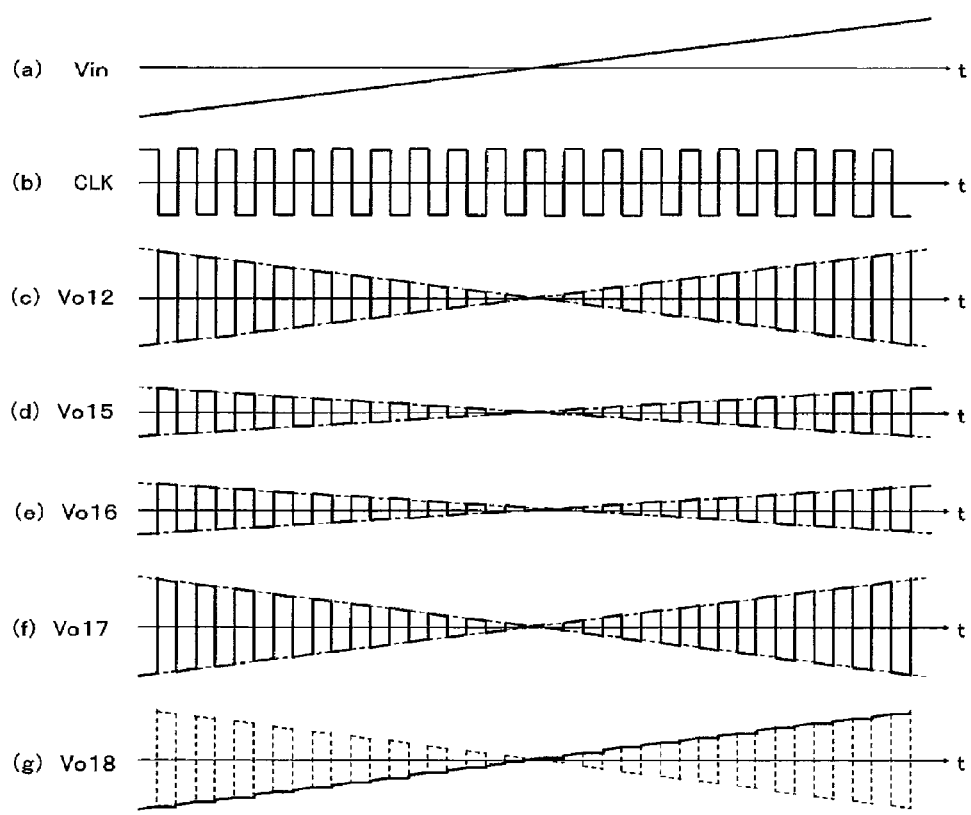
FIG. 2 is a timing chart illustrating an operation of amplifying an input signal performed by the operational amplifier circuit according to the embodiment of the present invention.
Figure 3:
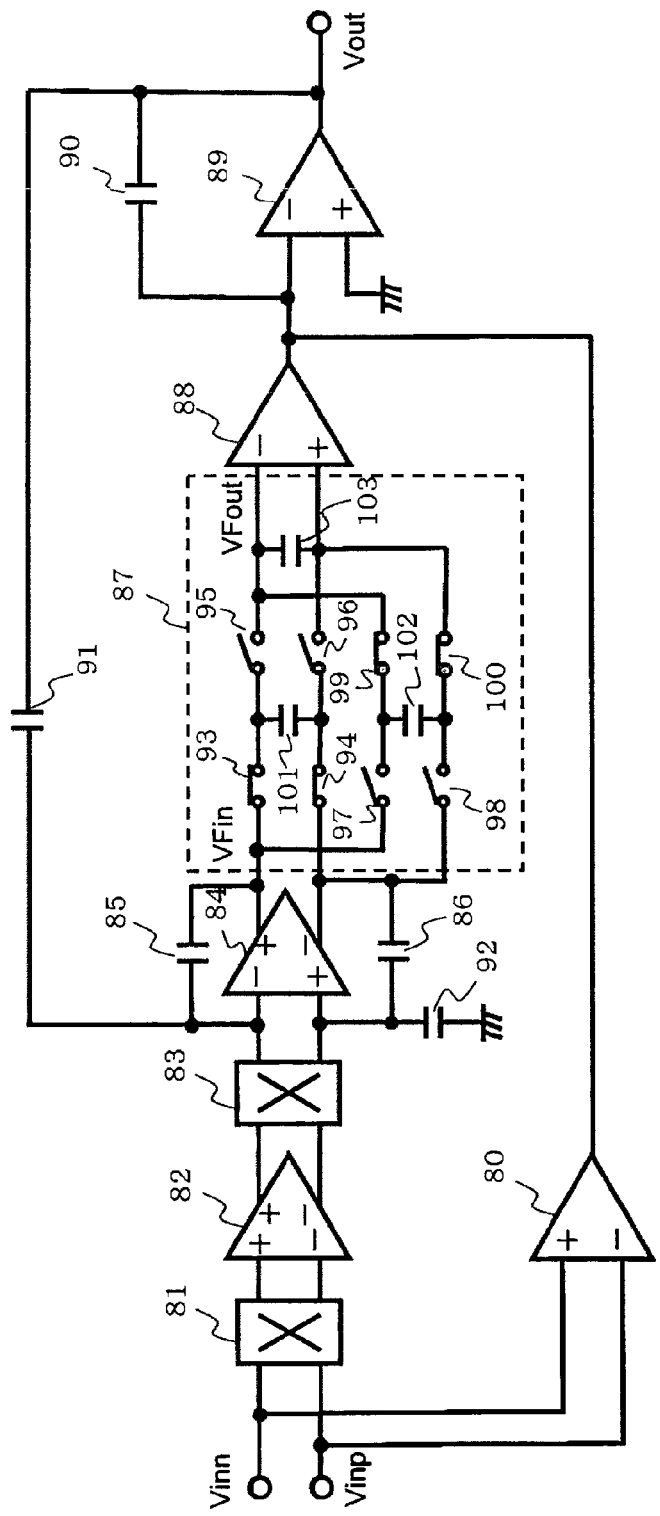
FIG. 3 is a block diagram illustrating a related-art operational amplifier circuit.

FIG. 2 is a timing chart illustrating an operation of amplifying the input signal voltage Vin in the case where the input offset voltage of the amplifier stage 12 is assumed to be 0. The waveform (a) represents the input signal voltage Vin. The waveform (b) represents a control clock CLK of the chopping circuit 11 and the sample and hold circuit 18, which has a sufficiently higher frequency than that of the input signal voltage Vin. The waveform (c) represents the output terminal voltage Vo12 of the amplifier stage 12, which is a voltage obtained by modulating the input signal voltage Vin by the chopping circuit 11 and amplifying the modulated signal voltage by the amplifier stage 12. The waveform (d) represents the output terminal voltage Vo15 of the weighting circuit 15, which is a voltage obtained by multiplying the output terminal voltage Vo12 of the amplifier stage 12 by 0.5. The waveform (e) represents the output terminal voltage Vo16 of the weighting circuit 16, which is a voltage obtained by delaying the output terminal voltage Vo12 of the amplifier stage 12 by the delay circuit 14 by a half period of the control clock CLK of the chopping circuit 11 and multiplying the resultant voltage by 0.5. The waveform (f) represents the output terminal voltage Vo17 of the adder circuit 17, which is a voltage obtained by adding the output terminal voltage Vo15 of the weighting circuit 15 and the output terminal voltage Vo16 of the weighting circuit 16. The waveform (g) represents the output terminal voltage Vo18 of the sample and hold circuit 18. The voltage Vo18 follows the output terminal voltage Vo17 of the adder circuit 17 when the control clock CLK is High, whereas the voltage Vo18 is held when the control clock CLK is Low. As shown in the waveform (g), the output terminal voltage Vo18 of the sample and hold circuit 18 becomes substantially equal to the output terminal voltage Vo12 of the amplifier stage 12. This means that the input signal voltage Vin is amplified substantially linearly.

It is revealed from the above description that the operational amplifier circuit according to the embodiment of the present invention is capable of amplifying the input signal voltage Vin while removing the input offset voltage of the amplifier stage 12.

What is claimed is:

1. An operational amplifier circuit for amplifying a signal input to input terminals and outputting the amplified signal to an output terminal, the operational amplifier circuit comprising:
   a first amplifier stage connected to the input terminals of the operational amplifier circuit;
   a chopping circuit connected to the input terminals of the operational amplifier circuit, the chopping circuit being controlled by a first clock and having a function of modulating the input signal;
   a second amplifier stage connected to output terminals of the chopping circuit;
   a filter connected to output terminals of the second amplifier stage that is configured to add a signal output from the second amplifier to a delayed version of the signal so that the filter has a finite impulse response (FIR) characteristic;
   a sample and hold circuit connected to the FIR filter, the sample and hold circuit being controlled by a second clock that is synchronized with the first clock;
   a third amplifier stage connected to output terminals of the sample and hold circuit; and
   a fourth amplifier stage connected to an output terminal of the first amplifier stage and an output terminal of the third amplifier stage, the fourth amplifier stage including an output terminal connected to the output terminal of the operational amplifier circuit.

2. An operational amplifier circuit according to claim 1, wherein the FIR filter comprises:
   a first weighting circuit connected to input terminals of the FIR filter and having a predetermined amplification factor;
   a delay circuit connected to the input terminals of the FIR filter and having a function of outputting the input signal with a predetermined delay period;
   a second weighting circuit connected to output terminals of the delay circuit and having a predetermined amplification factor; and
   an adder circuit connected to an output terminal of the first weighting circuit and an output terminal of the second weighting circuit and having a function of adding input signals.

* * * * *